United States Patent [19]

McKinney et al.

[11] Patent Number: 4,965,534

[45] Date of Patent: Oct. 23, 1990

[54] CHANNEL FREQUENCY GENERATOR FOR USE WITH A MULTI-FREQUENCY OUTPUT GENERATOR

[75] Inventors: Larry S. McKinney, Auburn; Rezin E. Pidgeon, Jr., Atlanta, both of Ga.

[73] Assignee: Scientific Atlanta, Atlanta, Ga.

[21] Appl. No.: 354,277

[22] Filed: May 19, 1989

[51] Int. Cl.$^5$ ............................................ H03B 21/00
[52] U.S. Cl. ........................................ 331/37; 331/38; 331/40
[58] Field of Search ..................... 331/37, 38, 40, 41, 331/42

[56] References Cited

U.S. PATENT DOCUMENTS 4,105,949 8/1978 Hardin ................................. 331/37

OTHER PUBLICATIONS

Scientific Atlanta Broadband Communications Products Catalog, Models 6350, 6330A, Television Modulator.
Scientific Atlanta Broadband Communications Products Catalog, Model 9220 NTSC Television Modulator.
Scientific Atlanta Broadband Communications Products Catalog, Model 9260 Frequency Agile Modulator.
Scientific Atalnta Broadband Communications Products Catalog, Models 6150, 6130A, Signal Processor.
Scientific Atlanta Broadband Communications Products Catalog, Models 6105B/6106B Comb Generator.
General Instrument Installation Manual No. 436-28-0-200 for Jerrold Commander 5 Modulator, Models C5M and C5MP.

*Primary Examiner*—Robert J. Pascal
*Attorney, Agent, or Firm*—Banner, Birch, McKie & Beckett

[57] ABSTRACT

An apparatus and method is disclosed which phase locks a frequency-agile modulated output signal to any selected channel of a comb generated output. The phase error of an input signal is tracked, the input signal is modulated up to a carrier output frequency, and the modulated output frequency is locked to the comb generator output by subtracting the input signal and negating the phase error.

23 Claims, 1 Drawing Sheet

CHANNEL FREQUENCY GENERATOR FOR USE WITH A MULTI-FREQUENCY OUTPUT GENERATOR

TECHNICAL FIELD

The present invention generally relates to a channel frequency generator for use with a multi-frequency output generator and, more particularly, to a microprocessor controlled cable television channel frequency generator which phase locks a frequency-agile modulated output to the same frequency as that of any selected channel of a comb generated output.

BACKGROUND OF THE INVENTION

In general, a phase lock loop is a circuit that can be used to synchronize a variable local oscillator's signal with the phase of an intermediate frequency (IF) signal or, more broadly, a circuit that controls an oscillator or periodic frequency generator so as to operate it with a constant phase angle relative to a reference signal source.

A problem arises in attempting to phase lock a frequency-agile modulated output to the same frequency as that of a specific tooth of a comb generated output. In the prior art, a circuit had to be specifically designed and tuned to the desired comb tooth in order to generate incrementally related frequencies. This operation is difficult and expensive to do in a frequency-agile setting where it is desired to select from a plurality of comb frequencies.

For example, in one configuration, a comb generator (a circuit that produces discrete regularly spaced frequencies) may be used at the headend of a cable television system to produce an output frequency corresponding to each of a plurality of channels provided by the headend. One of two types of comb generators may be used—a harmonically related coherent (HRC) and an incrementally related coherent (IRC) comb generator. An HRC comb generator may provide a channel at 54 MHz, 60 MHz, 66 MHz, and so on up to the maximum channel frequency. An IRC comb generator is similarly operated, except that every channel is translated (shifted), up in frequency by 1.25 MHz (e.g., 55.25 MHz, 61.25 MHz, 67.25 MHz, etc.). The IRC comb generator provides a signal which is generated from two frequency components: a spacing frequency and a translating frequency. In general, these frequencies are not phase coherent with the headend's input video IF signal. Consequently, phase locking the video IF signal to the IRC comb generated frequency is made complicated because of the non-coherent phase of these two signals.

In a conventional fixed channel cable television system, a particular tooth of a comb generator is selected with a bandpass filter, as a function of the desired channel and frequency to be output from the headend. For example, to tune channel 3 at 61.25 MHz, a fixed channel converter comprises a bandpass filter which is tuned to that particular comb channel. In order to tune different channels, the bandpass filter has to be changed. In the prior art, the complete module which contains the filter has to be changed.

In a known configuration, a filtered comb tooth is mixed with a desired output channel local oscillator to produce a 45.75 MHz component. This component is phase locked to the modulated IF signal by varying the local oscillator frequency. This known system, the Scientific Atlanta Model 6350, is a CATV quality fixed channel modulator. In the cable television business, it is desirable to replace fixed channel units with frequency-agile units in order to achieve operational flexibility when using either a HRC or IRC generator.

Some cable television headends presently phase lock each channel's output signal to a particular tooth in a single comb generator. These comb generators produce a plurality of equally spaced operating frequencies (i.e., for IRC, 55.25 MHz, 61.25 MHz, 67.25 MHz, etc.). In most fixed channel output frequency applications, an appropriate tooth corresponding to a desired output channel frequency is used to provide the phase lock signal. The IRC comb generator is particularly difficult to phase lock in a frequency-agile situation, because the component signals frequencies are non-coherent with respect to the IF signal frequency. Consequently, when a frequency-agile up/down converter is used for these headend operations and each time a new output frequency is desired, the filter used to select a proper comb tooth has to be changed thereby negating most of the benefits of a frequency-agile system.

The problem occurs for these headends in using an IRC comb generator, because of the two frequencies used to generate the comb signals. FIG. 1 shows the component signals of a typical IRC comb generator. The first component, Fs, is the frequency of the normal spacing between channels (usually 6 MHz). The second component, Ft, is the translation frequency (e.g., 277.25 MHz). Both of these components must be used in order to accurately synchronize the output frequency of the up/down converter with the respective tooth of the IRC comb generator.

SUMMARY OF THE INVENTION

Accordingly, it is an object of the present invention to phase lock a frequency-agile modulated output to the same frequency as that of any selected channel of a comb generated output.

It is a further object of the present invention to remove the effects of frequency errors in the modulated input signal by subtracting these out at the second intermediate frequency.

In meeting these object, the problems mentioned above in the prior art are solved by selecting only two teeth of the IRC comb generator's output, since the bandpass filter (and module) does not have to be changed for each channel frequency desired. Each up/-down converter frequency is mixed with the signals from the same two comb teeth; therefore, the bandpass filter may remain fixed.

In accordance with the present invention, a channel frequency generator for use with a multi-frequency output generator is provided to which uses a phase lock loop responsive to selected outputs of the multi-frequency output generator, to provide a frequency coherent output at a selected frequency by modulating an input signal at a predetermined frequency spacing with respect to the selected frequency.

BRIEF DESCRIPTION OF THE DRAWINGS

A more complete appreciation of the present invention and many of the attendant advantages thereof will be readily obtained as the invention becomes better understood by reference to the following detailed description when considered in connection with the accompanying drawing.

DETAILED DESCRIPTION OF THE PREFERRED EMBODIMENT

Figure 1:
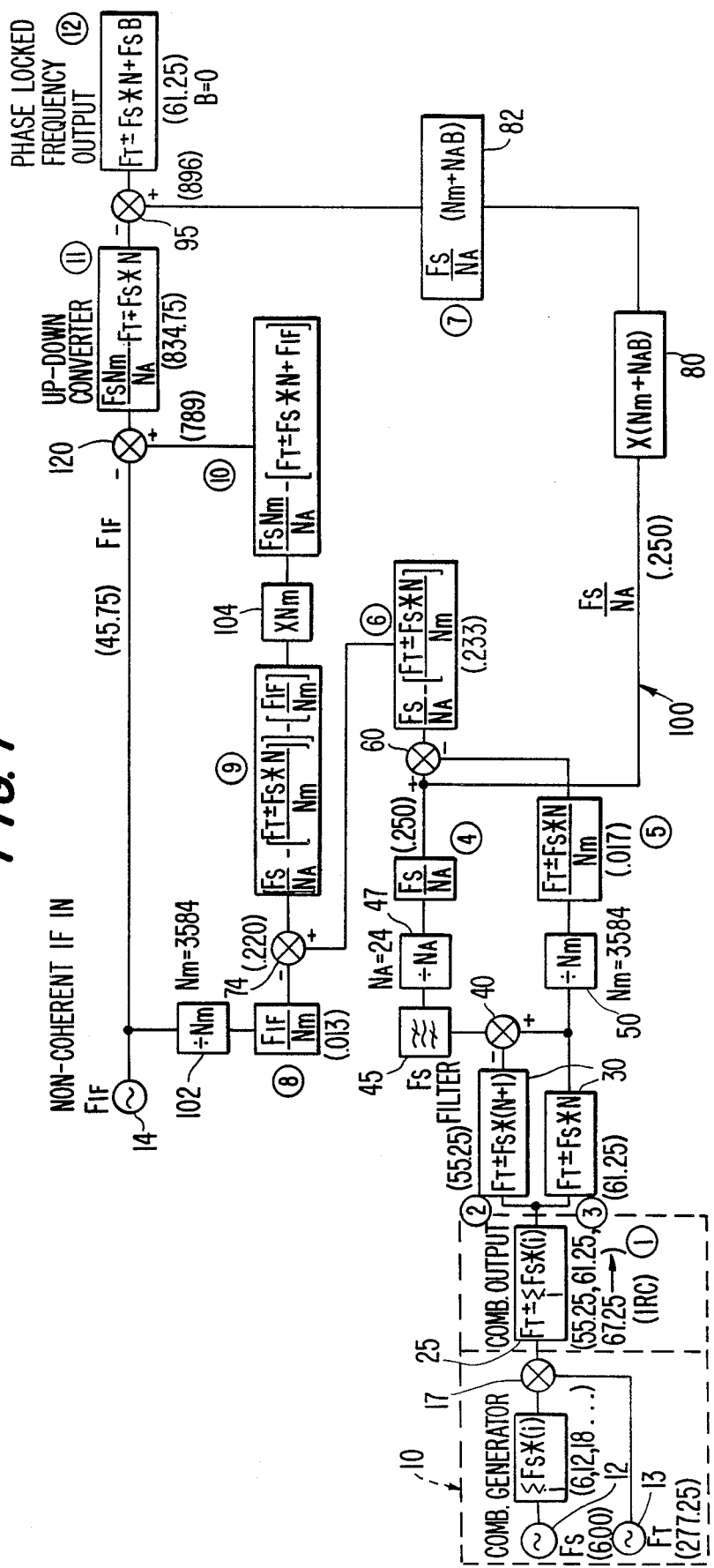
FIG. 1 is a block diagram illustrating an embodiment of the present invention.

Table 1 defines the parameters utilized in the discussion below.

TABLE I

| | |
|---|---|
| $F_s$ | Frequency of spacing component of comb |
| $F_t$ | Frequency of transition component of comb |
| $N_m$ | Divide number common to IF, comb and both multiplier chains |
| $N_a$ | Spacing component divide ratio |
| N | Integer value which selects the desired comb frequency |
| $F_{IF}$ | Frequency of IF input |
| B | Integer used to select the desired output frequency |
| i | Integer |

Referring to FIG. 1, multi-frequency output generator 10, which in the preferred embodiment is an IRC comb generator, includes frequency source 12 and frequency source 13. Although an IRC comb generator is illustrated, the invention is not limited in this respect and other multi-frequency output generators such as HRC comb generators may be used. Frequency source 12 generates a signal having a frequency $F_s$ equal to 6 MHz. $F_s$ represents the frequency of the spacing component of the comb. Frequency source 13 generates a signal having a frequency $F_T$ equal to 277.25 MHz. $F_T$ represents the frequency of the translation component of the comb. It should be noted that these frequencies are illustrative of an embodiment capable of use in a cable television system and the present invention is not limited in this respect. The outputs of frequency sources 12 and 13 are multiplied by mixer 17 to generate a comb output. The comb output contains frequencies which may be determined by the equation $$F_T \pm \sum_i F_S * (i) \tag{1}$$

This equation is shown in block 25. Thus, as indicated above, the output frequencies are generated from two components: a first spacing component $F_s$ and a second translation component $F_T$. The output signal is to be made phase coherent with the product of the spacing component, $F_S$, and the translation component, $F_T$.

In accordance with the present invention, a first and second comb output (i.e., two teeth) are selected from the comb of frequencies as indicated at 30. The selected teeth are characterized in the equations $$F_T \pm F_S*(N+1) \tag{2}$$

$$F_T \pm F_S*N \tag{3}$$

The selected frequencies in the present embodiment as utilized in a cable television environment, are 55.25 MHz and 61.25 MHz, respectively, although the invention is not limited in this respect. Although various frequencies may be chosen, it is preferable that the lowest adjacent frequencies or teeth of the comb generator be utilized to minimize design complexity.

The selected frequencies are multiplied as indicated by mixer 40. The output of mixer 40 is supplied to bandpass filter 45 such that the 6 MHz spacing frequency $F_S$ is generated. The 6 MHz signal is subsequently divided by a divider schematically indicated at 47. The divide ratio $N_A$ is hardware implementation dependent and is chosen to reduce design complexity with respect to factors such as filtering. In the present embodiment $N_A$ has been chosen to be 24. This generates an output signal having a frequency of $$F_S/N_A \tag{4}$$

or 250 kHz where $F_S$ is equal to 6 MHz and $N_A$ is equal to 24.

The selected 61.25 MHz signal is also supplied to a divider 50. Divider 50 has a divide ratio $N_m$ of 3584. Divide ratio $N_m$ is common to the IF, comb, and both multiplier chains as described below and is chosen in a manner described in detail below. The output signal of divider 50 has a frequency of $$\frac{F_T \pm F_S * N}{N_m} \tag{5}$$

or approximately 17 kHz where $F_T \pm F_S*N$ is equal to 61.25 MHz and $N_m$ +3584.

The outputs represented by equations 4 and 5 are multiplied as indicated by mixer 60 to generate an output signal having a frequency of $$\frac{F_S}{N_A} - \left[ \frac{F_T \pm F_S * N}{N_m} \right] \tag{6}$$

or approximately 233 kHz (i.e., 250 kHz–17 kHz). The output of mixer 60 is supplied to mixer 74.

The output signal represented by equation (4) is also utilized in what will be referred to as the lower phase lock loop circuit (lower loop), generally indicated as 100. The output signal represented by equation (4) is fed to a multiplier 80 which multiplies the frequency by a factor $(N_m + N_A B)$ to generate an output having a frequency $$\frac{F_S}{N_A} (N_m + N_A B) \tag{7}$$

This equation is shown in block 82. The output of lower loop 100 is then supplied to mixer 95.

A non-coherent IF input of approximately 45.75 MHz from frequency source 14 is fed to divider 102. In a preferred embodiment, this IF input represents the incoming video signal to a particular channel module in the headend of a cable television system although the invention is not limited in this respect. The IF input may also represent the incoming IF signal in another type of communication system, such as a radar or satellite communication system. Divider 102 has a divide ratio of $N_m$ or 3584 as noted above. The output of divider 102 has a frequency of $$F_{IF}/N_m \tag{8}$$

or approximately 13 kHz where $F_{IF}$ is equal to 45.75 MHz and $N_m$ is equal to 3584.

The output of divider 102 is fed to mixer 74 as shown. As noted above, the output of mixer 60 is also supplied to mixer 74. The output of mixer 74 has a frequency $$\frac{F_S}{N_A} - \left[ \frac{F_T \pm F_S * N}{N_m} \right] - \left[ \frac{F_{IF}}{N_m} \right] \tag{9}$$

or approximately 220 kHz (i.e., 233 kHz−13 kHz).

The output of mixer 74 is multiplied by multiplier 104. The multiplying factor is $N_m$ or 3584. The output signal of multiplier 104 has a frequency of $$\frac{F_S N_m}{N_A} - [F_T \pm F_S * N + F_{IF}] \qquad (10)$$

or approximately 789 MHz (i.e., 22 kHz*3584).

The output of multiplier 104 is supplied to mixer 120 where it is multiplied as shown with the 45.75 MHz $F_{IF}$ signal. The output signal from mixer 120 has a frequency of $$\frac{F_S N_m}{N_A} - F_T \mp F_S * N \qquad (11)$$

or approximately 834.75 MHz (i.e., 789 MHz+45.75 MHz). The output signal of mixer 120 is supplied to mixer 95 where it is multiplied as shown with the output from the lower loop 100 to generate a frequency coherent output of $$F_T \pm F_S * N + F_S B \qquad (12)$$

or 61.25 MHz if B=0.

Thus, the purpose of the present invention is to track the phase error between the input video IF signal and the two IRC frequency components, and to cancel out the IF signal in order to negate the phase error. The circuitry of the present invention reproduces the first and second input signal components and phase locks them with the $F_{IF}$ signal. The variable N selects an arbitrary tooth of the comb. The B variable is an offset variable which permits agile channel selection.

The present invention overcomes the problems encountered in the prior art by providing a method and apparatus for locking the signal from a frequency-agile up/down converter to that from either an HRC or IRC comb generator, without having to modify or change the existing comb generator.

In its broadest sense, the invention heterodynes the IF signal up to an output carrier frequency, such that the input is phased locked to the corresponding frequency in the output of the comb generator. The heterodyning process is accomplished by using only two reference frequencies from the comb generator output, irrespective of which comb output frequency the heterodyning output is supposed to equal.

As noted above, the present invention is not limited to the values above-assigned to variables $N_m$ and $N_A$. Further, any two teeth of a comb generator may be used. These factors are presently determined by the desired output frequency of mixer 120, i.e., the secondary IF output frequency. This output frequency is generally given by the equation $$F_3 = \frac{F_S}{j} * \frac{N_m}{N_A} - F_2 \qquad (13)$$

where j is equal to the number of spacing components between teeth, $F_S$ is equal to the frequency difference between selected teeth, $F_3$ is the secondary IF frequency, and $$F_2 = F_T \mp F_S * N \qquad (14)$$

In the above-described embodiment, j is equal to 1 since adjacent comb teeth are utilized. Any values for j, $N_m$, and $N_A$ which satisfy these equations may be utilized. However, in practice, these values are limited by design requirements.

The invention has been described in detail in connection with the preferred embodiments. These embodiments, however, are merely for example only and the invention is not restricted thereto. It will be easily understood by those skilled in the art that other variations and modifications can easily be made within the scope of this invention as defined by the appended claims.

We claim:

1. A channel frequency generator for use in an incrementally related coherent signal generator, said channel frequency generator comprising:
    means for deriving a first and second frequency from selected outputs of said incrementally related coherent signal generator; and
    modulating means for modulating an input signal having a predetermined frequency to a frequency coherent selected channel frequency utilizing the first and second frequencies.

2. The channel frequency generator according to claim 1 wherein the incrementally related coherent signal generator comprises a comb generator.

3. The channel frequency generator according to claim 2 wherein said comb generator comprises an incrementally related coherent comb generator.

4. The channel frequency generator according to claim 3 wherein the first frequency comprises a spacing frequency and the second frequency comprises a translation frequency.

5. The channel frequency generator according to claim 2 wherein the selected outputs comprise first and second, immediately adjacent, comb generator outputs.

6. The channel frequency generator according to claim 5 wherein the first comb generator output comprises the output providing the lowest frequency.

7. The channel frequency generator according to claim 2 wherein the first and second comb generator output frequencies are spaced apart by the amount of a predetermined spacing frequency.

8. A method of generating a frequency coherent output signal for use with an incrementally related coherent signal generator, the method comprising the steps of:
    deriving a first frequency and a second frequency from at least one selected output of said incrementally related coherent signal generator; and
    modulating an input signal having a predetermined frequency to a frequency coherent selected channel frequency utilizing the first and second frequencies.

9. The method according to claim 8 wherein the incrementally related coherent signal generator comprises a comb generator.

10. The method according to claim 9 wherein said comb generator comprises an incrementally related coherent comb generator.

11. The method according to claim 10 wherein the first frequency comprises a spacing frequency and the second frequency comprises a translation frequency.

12. The method according to claim 9 wherein the selected outputs comprises first and second, immediately adjacent, comb generator outputs.

13. The method according to claim 10 wherein the first comb generator output comprises the output providing the lowest frequency.

14. The method according to claim 10 wherein the first and second comb generator output frequencies are spaced apart by the amount of a predetermined spacing frequency.

15. The channel frequency generator according to claim 1 or 8 wherein said predetermined frequency input signal comprises a predetermined noncoherent frequency input signal.

16. A channel frequency generator for use in a multi-frequency output generator, said channel frequency generator comprising:
   means for deriving a spacing frequency and a translation frequency from selected outputs of said multi-frequency output generator; and
   modulating means for modulating an input signal having a predetermined frequency to a frequency coherent selected channel frequency utilizing the spacing frequency and the translation frequency.

17. The channel frequency generator according to claim 16 wherein said multi-frequency output generator comprises a comb generator.

18. The channel frequency generator according to claim 17 wherein said comb generator comprises an incrementally related coherent comb generator.

19. The channel frequency generator according to claim 17 wherein said comb generator comprises a harmonically related coherent comb generator.

20. A method of generating a frequency coherent output signal for use with a multi-frequency output generator, the method comprising the steps of:
   deriving a spacing frequency and a translation frequency from selected outputs of said multi-frequency output generator; and
   modulating an input signal having a predetermined frequency to a frequency coherent selected channel frequency utilizing the spacing frequency and the translation frequency.

21. The method according to claim 20 wherein the multi-frequency output generator comprises a comb generator.

22. The method according to claim 21 wherein said comb generator comprises an incrementally related coherent comb generator.

23. The method according to claim 21 wherein said comb generator comprises a harmonically related coherent comb generator.

* * * * *